United States Patent [19]

Lee et al.

[11] 4,045,786

[45] Aug. 30, 1977

[54] MAGNETIC DOMAIN MEMORY DEVICE HAVING AN IMPROVED DRIVE COIL ARRANGEMENT

[75] Inventors: Fred S. Lee, Oklahoma City; William F. Neu, Bethany, both of Okla.

[73] Assignee: Honeywell Information Systems Inc., Waltham, Mass.

[21] Appl. No.: 503,023

[22] Filed: Sept. 3, 1974

[51] Int. Cl.² ............................................. G11C 19/08
[52] U.S. Cl. .......................... 340/174 TF; 340/174 BA
[58] Field of Search ................. 340/174 TF; 336/200, 336/224

[56] References Cited

U.S. PATENT DOCUMENTS 3,848,209  11/1974  Lee et al. ....................... 340/174 TF

FOREIGN PATENT DOCUMENTS 322,499  7/1920  Germany ............................ 336/224

Primary Examiner—James W. Moffitt
Attorney, Agent, or Firm—Ronald T. Reiling; Nicholas Prasinos

[57] ABSTRACT

An improved drive coil for a magnetic domain memory device has varying separation between adjacent conductors to improve the uniformity of the magnetic field.

2 Claims, 4 Drawing Figures

MAGNETIC DOMAIN MEMORY DEVICE HAVING AN IMPROVED DRIVE COIL ARRANGEMENT

BACKGROUND OF THE INVENTION

The present invention relates to magnetic domain memory devices and more particularly to an improved drive coil assembly for use in such devices.

Magnetic domains or bubbles are minute cylindrical areas that can be generated and maintained in thin films or chips of magnetic material. The thin films can be used to store binary data. The presence of a domain can represent a binary 1. The absence of a domain can represent a binary 0. The domains, which are magnetized oppositely from the rest of the thin film material, can be propagated along Permalloy tracks on the film surface by a rotating magnetic field generally referred to as a drive field. The drive field is generated by an assembly consisting of independently-energizable orthogonal coils, normally referred to as X and Y drive coils. The lines of force in a drive field are generally parallel to the surface of the domain material chip. Track arrangements for performing shift functions and logic operations are well known in the art.

The strength of the magnetic drive field acting on a domain is critical. If the drive field is too strong, a domain may be forced from a track under certain conditions, with resulting loss of a data bit. A drive field which is too strong may also cause a domain to be propagated farther than intended, particularly at corners of the track. The data is naturally distorted by such an occurrence.

Conversely, a drive field which is too weak may fail to propagate a domain as intended. Such a failure also results in distortions in the stored data.

Current practice call for several thin films or chips to be mounted on a single ceramic substrate and for several substrates to be stacked in single memory device. The drive field acting on the domains in any one of these chips must always be strong enough to propagate the domains but yet not so strong as to force the domains from the tracks or farther along the track than intended.

In prior art drive coils, the conductors in each coil are uniformly spaced. The magnetic field generated by such a coil has a peak distribution which has a maximum at the center of the memory device, but which falls toward a minimum value as the edges of the coil are approached. Placing all chips only in areas known to be subject to magnetic fields having acceptable minimum and maximum values assures that magnetic domains can be consistently propagated. However, the number of chips which can be placed is necessarily limited as is the data storage capacity of such an assembly.

The data storage capacity of a magnetic domain memory device can be increased by increasing the area suitable for chip placement. In the prior art, attempts have been made to increase the useful area by the simple expediency of increasing the overall physical size of the drive coil assembly. There are drawbacks to this approach. A larger drive coil presents a greater impedance during high frequency operations. As a result, increased amounts of power must be dissipated. Moreover, the rate at which bubbles can be propagated across the thin film surface is limited by the frequency-dependent inductive component of the coil impedance.

SUMMARY OF THE INVENTION

The present invention increases the usable area in a magnetic domain memory device without increasing drive coil dimensions or power dissipation requirements. The invention is an improved drive coil assembly wherein the spacing between adjacent conductors in each of the coils is varied so as to allow a more uniform drive field to be generated upon energization of the coil.

DESCRIPTION OF THE DRAWINGS

While the specification concludes with claims particularly pointing out and distinctly claiming that which is regarded as the present invention, further details of preferred embodiments of the invention may be more readily ascertained from the following detailed description when read in conjunction with the accompanying drawings wherein:

DETAILED DESCRIPTION

Figure 1:
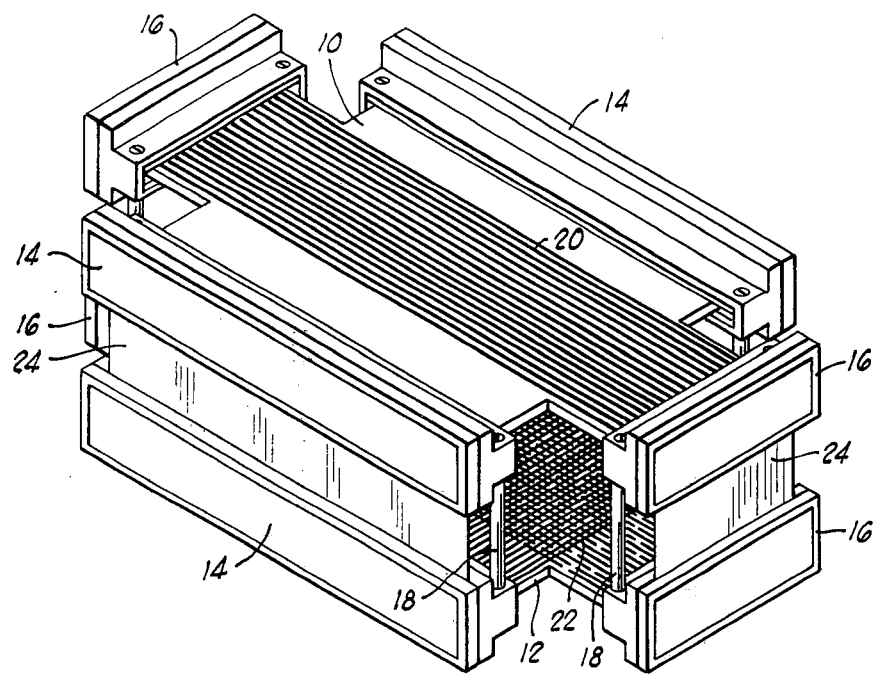
FIG. 1 is a perspective view of a drive coil assembly into which the present invention may be incorporated.

Referring now to FIG. 1, one type of orthogonal drive coil assembly into which the present invention may be readily incorporated includes an upper planar board 10 and a spaced, lower planar board 12. Both boards may be made of conventional epoxy material. Each of the longer edges of the boards 10 and 12 is held by an elongated connector 14. There are four such connectors in the completed coil assembly but only three can be seen in FIG. 1. Each of the shorter sides of the boards 10 and 12 is held within a shorter connector 16. All four of the shorter connectors 16 in the assembly are shown at least in part in FIG. 1. The boards 10 and 12 are held apart by cylindrical spacers 18 secured to the connectors by means of screws threaded through the connectors into the spacers.

The visible side of the upper planar board 10 carries an etched set of parallel conductors 20 which can be formed by batch fabrication techniques commonly used in the manufacture of printed wiring boards. The underside of board 10 (not visible in FIG. 1) also carries an etched set of parallel conductors orthogonal or perpendicular to the etched set 20 on the upper side of board 10. The lower board 12 has an etched set of conductors 22 which parallel the conductors on the underside of board 10. Conductors (not shown) formed on the underside of board 12 parallel the conductors 20 on the visible side of board 10.

Interconnecting sheets 24 are used to couple the conductors on the board 10 with the conductors on the board 12 at the connectors 16. Each of the interconnecting sheets 24 carries conductors which are parallel to and have the same spacing as the corresponding conductors on the boards.

In a prior art coil, adjacent conductors would be uniformly spaced from one another. Generally, the magnetic field established by a single conductor is strongest adjacent the conductor and becomes increasingly weaker as the distance from the conductor increases. The magnetic field established by a number of parallel conductors at any point can be determined by algebraically summing the magnetic field established by the individual conductors at that point. For a conventional prior art coil, the summation has a peak value at the center of the coil. The summation decreases rapidly as the outermost conductors in the coil are approached.

Figure 2:
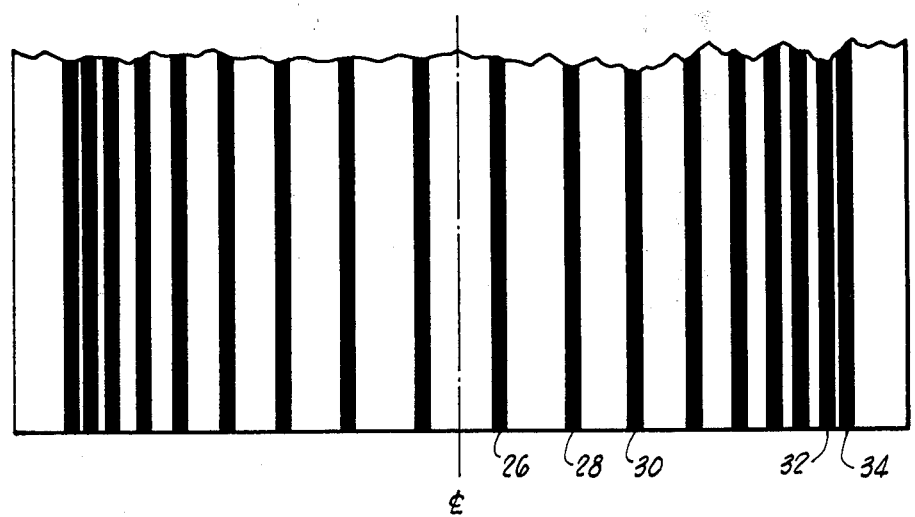
FIG. 2 is a plan view of a conductor board carrying variably spaced conductors.

To increase the usable area in a magnetic domain memory device, the present invention varies the spacing between adjacent conductors to create a plateau in the magnetic field distribution. Conductors at or near the center of the coil are space farther apart than conductors at or near the edges. Referring to FIG. 2, which is a plan view of a conductor-carrying board such as board 10, the conductor 26 nearest the center line of the board is widely seperated from adjacent conductor 28. Conductor 28 is not so widely separated from adjacent conductor 30. The spacing between adjacent conductors gradually decreases as the edges of the board are approached. The minimum spacing on the board occurs between the outermost conductor 34 on the board and the adjacent conductor 32.

While only those conductors on the right side of the center line of the board have been numbered and discussed, the arrangement of conductors to the left of the center mirrors the arrangement to the right of the center line. That is, the conductors are spaced most closely together at the left edge of the board and most widely near the center line of the board.

Figure 3:
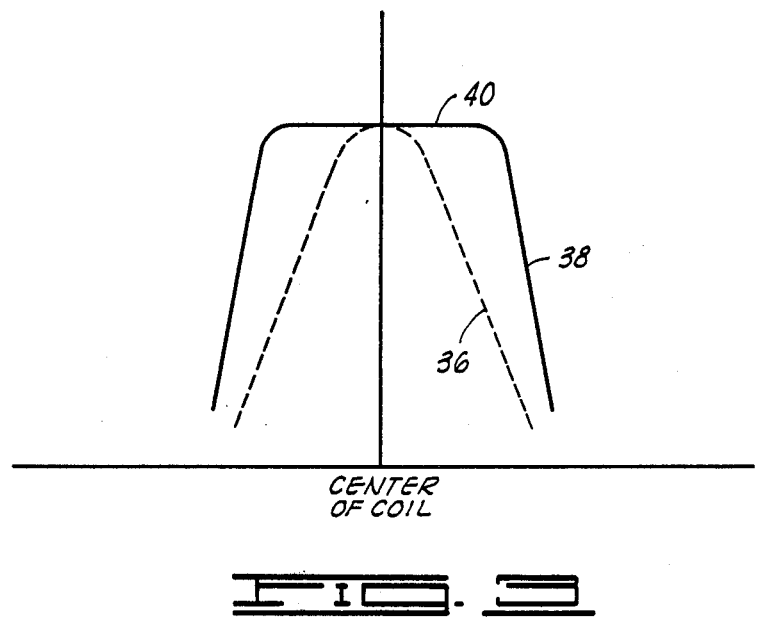
FIG. 3 is a graph depicting the field distribution for a prior art drive coil and for a drive coil constructed in accordance with the present invention.

Referring to FIG. 3, the magnetic field distribution for a conventional prior art coil is represented by a curve 36 having a peak at the center line of the coil. The magnetic field for a coil of the type shown in FIG. 2 is represented by a curve 38 having a plateau 40 extending for some distance on either side of a center line of the coil. The uniformity of the magnetic field beneath the plateau 40 permits placement of thin films over a much greater area than would be possible in a conventional assembly.

Figure 4:
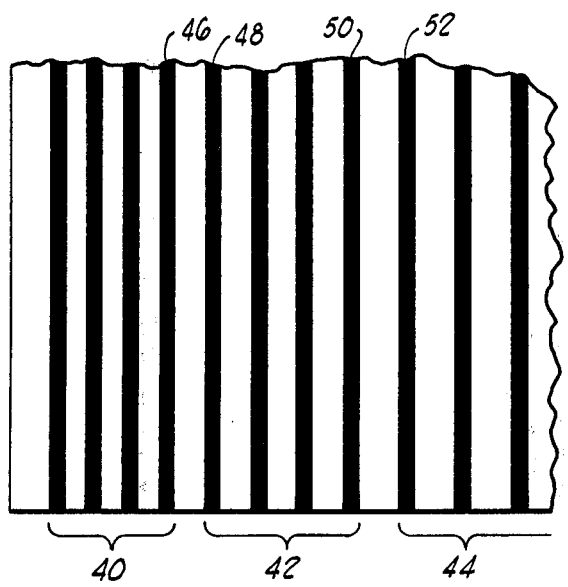
FIG. 4 is a plan view of an alternated embodiment of a conductor board having grouped conductors.

FIG. 4 depicts an alternate embodiment. In this embodiment, groups of conductors are spaced on the boards with the spacing between groups being varied while the spacing within the groups remains constant. That is, the spacing between adjacent conductors within group 40 is constant. However, the spacing between the right hand conductor 46 in group 40 and the left hand conductor 48 in the group 42 of four conductors is slightly increased. The spacing between the adjacent conductors in group 42 matches the spacing between conductors 46 and 48. Similarly, the spacing between the right hand conductor 50 in group 42 and the left hand conductor 52 in group 44 is further increased. The greater spacing occurs between the adjacent conductors within the group 44.

While there have been described what are considered to be preferred embodiments of the present invention, variations and modifications will occur to those skilled in the art once they learn of the invention. Therefore, it is intended that the appended claims shall be construed to cover all such variations and modifications as fall within the true spirit and the scope of the invention.

We claim:

1. A magnetic domain memory device including substrates carrying domain materials, and independently energizable drive coils positioned to encompass said substrate for generating magnetic fields whose lines of force are parallel to the surface of said magnetic domain memory device, the improvement wherein:

each of said drive coils includes a plurality of individual adjacent conductors, the spacing between the individual conductors gradually increasing as the centerline of the coils is approached from opposite edges of the coil for providing a plateau in the distribution of said magnetic fields, thus maximizing the useful area in said substrate; and said magnetic domain memory device further including means for energizing each of said coils for generating said magnetic fields.

2. An improved magnetic domain memory device as recited in claim 1 wherein the individual conductors are more widely spaced at the center of the coil than at the edges.

* * * * *